US011676680B2

(12) United States Patent
Park

(10) Patent No.: US 11,676,680 B2
(45) Date of Patent: Jun. 13, 2023

(54) SRAM DYNAMIC FAILURE HANDLING SYSTEM USING CRC AND METHOD FOR THE SAME

(71) Applicant: Magnachip Semiconductor, Ltd., Chungcheongbuk-do (KR)

(72) Inventor: Sangsu Park, Chungcheongbuk-do (KR)

(73) Assignee: MAGNACHIP SEMICONDUCTOR, LTD., Chungcheongbuk-do (KR)

( * ) Notice: Subject to any disclaimer, the term of this patent is extended or adjusted under 35 U.S.C. 154(b) by 0 days.

(21) Appl. No.: 17/581,042

(22) Filed: Jan. 21, 2022

(65) Prior Publication Data

US 2022/0343991 A1 Oct. 27, 2022

(30) Foreign Application Priority Data

Apr. 23, 2021 (KR) .......................... 10-2021-0053042

(51) Int. Cl.
| | | |
|---|---|---|
| *G11C 29/42* | (2006.01) | |
| *G11C 29/44* | (2006.01) | |
| *G11C 29/12* | (2006.01) | |
| *G11C 29/00* | (2006.01) | |
| *G11C 29/18* | (2006.01) | |
| *G11C 29/36* | (2006.01) | |

(52) U.S. Cl.
CPC .......... *G11C 29/42* (2013.01); *G11C 29/1201* (2013.01); *G11C 29/18* (2013.01); *G11C 29/4401* (2013.01); *G11C 29/76* (2013.01); *G11C 2029/3602* (2013.01)

(58) Field of Classification Search
None
See application file for complete search history.

(56) References Cited

U.S. PATENT DOCUMENTS

2004/0088614 A1\* 5/2004 Wu ........................ G11C 29/88
714/765

FOREIGN PATENT DOCUMENTS

| CN | 104094351 A | * 10/2014 | .......... G06F 11/1004 |
|---|---|---|---|
| KR | 2008-0010868 A | 1/2008 | |
| WO | WO-2008061558 A1 | * 5/2008 | .......... G06F 11/1008 |

\* cited by examiner

*Primary Examiner* — Guerrier Merant
(74) *Attorney, Agent, or Firm* — Polsinelli PC

(57) ABSTRACT

A method for dynamically handling the failure of the static random-access memory (SRAM) dynamic failure handling system using a cyclic redundancy check (CRC) includes obtaining a write data; determining a write address; storing the write data at the write address of a frame memory which is composed of the SRAM and includes a real address area and a spare address area which are distinguished from each other; storing, in response to the write address, a write cyclic redundancy check (CRC) generated by performing a CRC calculation on the write data; determining a read address; reading a read data from the read address of the frame memory; determining whether, based on the A CRC remainder W_CRC corresponding to the read address and the read data, a CRC error occurs, and generating an error flag when the CRC error occurs; determining a fault address based on the error flag; and mapping the fault address to one of non-fault spare addresses of the spare address area when the fault address is an address of the real address area.

19 Claims, 11 Drawing Sheets

FIG. 5

| FAULT REAL ADDRESS UNIT (131) | NON-FAULT SPARE ADDRESS UNIT (132) |
|---|---|
| 0xFFFF | 0x8000 |
| 0xFFFF | 0x8001 |
| 0xFFFF | 0x8002 |
| 0xFFFF | 0x8003 |
| 0xFFFF | 0x8004 |
| 0xFFFF | 0x8005 |
| 0xFFFF | 0x8006 |
| 0xFFFF | 0x8007 |

FIG. 6

| FAULT REAL ADDRESS UNIT (131) | | FAULT REAL ADDRESS UNIT (131) | | FAULT REAL ADDRESS UNIT (131) | | FAULT REAL ADDRESS UNIT (131) |
|---|---|---|---|---|---|---|
| 0xFFFF | | 0x0080 | | 0x0080 | | 0x0080 |
| 0xFFFF | | 0xFFFF | | 0x0006 | | 0x0006 |
| 0xFFFF | | 0xFFFF | | 0xFFFF | | 0xFFFF |
| 0xFFFF | | 0xFFFF | | 0xFFFF | | 0xFFFF |
| 0xFFFF | | 0xFFFF | | 0xFFFF | | 0xFFFF |
| 0xFFFF | | 0xFFFF | | 0xFFFF | | 0xFFFF |
| 0xFFFF | | 0xFFFF | | 0xFFFF | | 0xFFFF |
| 0xFFFF | | 0xFFFF | | 0xFFFF | | 0xFFFF |
| (a) | obtain fault real address 0x0080 → | (b) | obtain fault real address 0x0006 → | (c) | obtain fault real address 0x0080 → | (d) |

SRAM DYNAMIC FAILURE HANDLING SYSTEM USING CRC AND METHOD FOR THE SAME

CROSS-REFERENCE TO RELATED APPLICATION

This application claims the priority of Korean Patent Application No. 10-2021-0053042 filed on Apr. 23, 2021, which is hereby incorporated by reference in its entirety.

BACKGROUND

Field of the Disclosure

The present disclosure relates to a static random-access memory (SRAM) dynamic failure handling system using a cyclic redundancy check (CRC) and a method for the same.

Description of the Background

As a process becomes more detailed, a static random-access memory (SRAM) cell is increasingly being used, so that the reliability of the SRAM cells becomes important. Due to the test time and cost of the SRAM cell, a built-in self-test (BIST) is performed on the SRAM cell under specific conditions (e.g., room temperature, low operating voltage, maximum operating frequency, etc.), and repair is performed when a failure occurs in a cell.

In the past, a test is performed mainly for the purpose of hard fault detection only. That is, repair is performed only once under the worst condition. When a failure occurs in the SRAM cell in an additionally performed test, failure handling is performed on the chip.

However, the failure of the SRAM includes the failure of the SRAM caused by impurities during a process, the failure of the SRAM caused by the increase of the number of uses due to continuous use of the SRAM, the failure of a plurality of the SRAMs caused by an external electro static discharge (ESD), etc.

Therefore, SRAM failure has been handled by performing the BIST and built-in self-repair (BISR) which generate and compare BIST patterns and addresses for writing and reading the SRAM. Alternatively, the SRAM failure has been handled by performing the BIST on the SRAM after POWER ON, storing a fault real address and a non-fault spare address in a register and remapping them. Alternatively, the SRAM failure has been handled by correcting error bits through use of an error correcting code (ECC).

As described above, failure has been handled by the BISR based on repair information stored in a non-volatile storage or a test result after the BIST operation. However, there is a problem that additional SRAM failures cannot be handled during the operation of the SRAM after the failure handling is completed.

SUMMARY

Accordingly, the present disclosure is directed to an SRAM dynamic failure handling system using a CRC and a method for the same that substantially obviate one or more of problems due to limitations and disadvantages described above.

More specifically, the present disclosure is directed to a dynamic handling device and a method for the same in that the dynamic handling device is capable of handling the SRAM failure even when failure occurs during the operation of the SRAM after the failed SRAM cell found by the BIST immediately after electric power is supplied is handled by the BISR.

The technical problem to be overcome in this document is not limited to the above-mentioned technical problems. Other technical problems not mentioned can be clearly understood from those described below by a person having ordinary skill in the art.

One aspect is a static random-access memory (SRAM) failure handling system which dynamically handles a failure of the SRAM based on an input data. The SRAM failure handling system includes a frame memory which is composed of the SRAM and includes a real address area and a spare address area which are distinguished from each other; a write controller which obtains a write data, determines a write address, and stores the write data at the write address of the frame memory; a read controller which determines a read address and reads a read data of the read address from the frame memory; a cyclic redundancy check (CRC) handler which stores a CRC remainder W_CRC generated by performing a CRC calculation on the write data, determines whether, based on the read data and the CRC remainder W_CRC, a CRC error occurs, and generates an error flag when the CRC error occurs; and a failure handler which receives the error flag from the CRC handler, determines a fault address based on the error flag, and maps the fault address to one of non-fault spare addresses of a spare address area when the fault address is an address of the real address area.

The failure handler includes a read address monitoring unit which monitors the read address determined by the read controller; and a dynamic address mapping unit which includes a fault real address unit including fault real address information and a non-fault spare address unit including non-fault spare address information.

The dynamic address mapping unit determines the fault address based on the received error flag and the read address monitoring united when the error flag is received, determines whether the fault address is a real address of the real address area or a spare address of the spare address area, adds the fault address to the fault real address unit when the fault address is the real address, deletes the fault address from the non-fault spare address unit when the fault address is the spare address, and generates fault address mapping information by mapping the real addresses comprised in the fault real address unit to the spare address remaining in the non-fault spare address unit.

The failure handler further includes a pre-failure storing unit which stores fault address information obtained based on a result of a pre-failure test performed before shipment. The dynamic address mapping unit obtains additionally the fault address from the pre-failure storing unit.

The failure handler further includes a built-in self-test (BIST) pattern generating unit which generates a BIST data for performing the BIST in order to recognize and handles the fault address before the frame memory starts normal operations, generates a BIST address at which the BIST data is to be stored, and transmits them to the write controller.

The write controller obtains a user address and a user data from the outside of the SRAM failure handling system. The write data is one of the user data or the BIST data. The write address is determined based on one of the user address or the BIST address.

When the user address or the BIST address is a fault address included in the fault address mapping information, the write controller determines the non-fault spare address to which the user address or the BIST address is mapped, as the write address, in the fault address mapping information.

The read controller receives an address for reading data from the outside of the SRAM failure handling system, and when the address is the fault address included in the fault address mapping information, the read controller determines the non-fault spare address to which the address is mapped, as the read address, in the fault address mapping information.

The dynamic address mapping unit starts again to update the fault real address unit and the non-fault spare address unit based on a first vertical synchronization signal received together with the address for reading data from the outside of the SRAM failure handling system, and transmits the fault address mapping information to the write controller and the read controller based on a second vertical synchronization signal obtained together with the user address and the user data from the outside of the SRAM failure handling system.

The CRC handler includes a CRC calculating unit which generates the A CRC remainder W_CRC by performing a CRC calculation on the write data; a CRC storing unit which stores the A CRC remainder W_CRC; and a CRC check unit which generates a CRC remainder R_CRC by performing the CRC calculation on the read data, obtains the CRC remainder W_CRC from the CRC storing unit, determines that no CRC error has occurred when the CRC remainder R_CRC is coincided with the CRC remainder W_CRC, determines that the CRC error has occurred when they are not coincided, and then, generates the error flag.

Another aspect is a method for dynamically handling a failure of a static random-access memory (SRAM) of a SRAM failure handling system which dynamically handles a failure of the SRAM based on an input data. The method includes obtaining a write data; determining a write address; storing the write data at the write address of a frame memory which is composed of the SRAM and includes a real address area and a spare address area which are distinguished from each other; storing, a CRC remainder W_CRC generated by performing a CRC calculation on the write data, at a CRC storing unit; determining a read address; reading a read data from the read address of the frame memory; determining whether, based on the CRC remainder W_CRC obtained from the CRC storing unit and the read data, a CRC error occurs, and generating an error flag when the CRC error occurs; determining a fault address based on the error flag; and mapping the fault address to one of non-fault spare addresses of the spare address area when the fault address is an address of the real address area.

The determining the fault address based on the error flag includes determining the read address at a time point when the error flag is received, as the fault address.

The mapping of the fault address to one of non-fault spare addresses of the spare address area when the fault address is an address of the real address area includes: determining whether the fault address is a real address of the real address area or a spare address of the spare address area; adding the fault address to the fault real address unit when the fault address is the real address; deleting the fault address from the non-fault spare address unit when the fault address is the spare address; and generating fault address mapping information by mapping the real address comprised in the fault real address unit to the spare address remaining in the non-fault spare address unit.

The method further includes: storing fault address information obtained based on a result of a pre-failure test performed before shipment; and obtaining additionally the fault address based on the fault address information.

The method further includes obtaining a user address and a user data from the outside of the SRAM failure handling system; and generating a built-in self-test (BIST) data for performing the BIST and generating a BIST address at which the BIST data is to be stored.

The obtaining the write data includes selecting one of the user data or the BIST data as the write data. The determining the write address includes determining the write address based on one of the user address or the BIST address.

The determining of the write address based on one of the user address or the BIST address includes determining the non-fault spare address to which the user address or the BIST address is mapped, as the write address, in the fault address mapping information, when the user address or the BIST address is the fault address included in the fault address mapping information.

The determining of the read address includes: receiving an address for reading data from the outside of the SRAM failure handling system; and determining the non-fault spare address to which the address is mapped, as the read address, in the fault address mapping information, when the address is the fault address included in the fault address mapping information.

The adding of the fault address to the fault real address unit when the fault address is the real address and the deleting of the fault address from the non-fault spare address unit when the fault address is the spare address are performed after receiving a first vertical synchronization signal together with an address for reading data from the outside of the SRAM failure handling system. The generating fault address mapping information by mapping the spare address remaining in the non-fault spare address unit to the real addresses included in the fault real address unit includes generating the fault address mapping information based on a second vertical synchronization signal obtained together with the user address and the user data from the outside of the SRAM failure handling system.

Even after failure handling of the failed SRAM cell has been completed, the failure handling can be performed on additional SRAM failures occurring during the operation of the SRAM.

The failure handling can be performed by performing, in real time, remapping of failures occurring in the SRAM.

It is possible to provide an SRAM dynamic failure handling system capable of determining whether a failure occurs after the BIST operations or not, by using user data, and capable of handling the failure.

Advantageous effects that can be obtained from the present disclosure are not limited to the above-mentioned effects. Further, other unmentioned effects can be clearly understood from the following descriptions by those skilled in the art to which the present disclosure belongs.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 5 shows initial values of a fault real address unit 131 and a non-fault spare address unit 132;

FIG. 6 shows an example of updating the fault real address unit 131;

DETAILED DESCRIPTION

Figure 1:
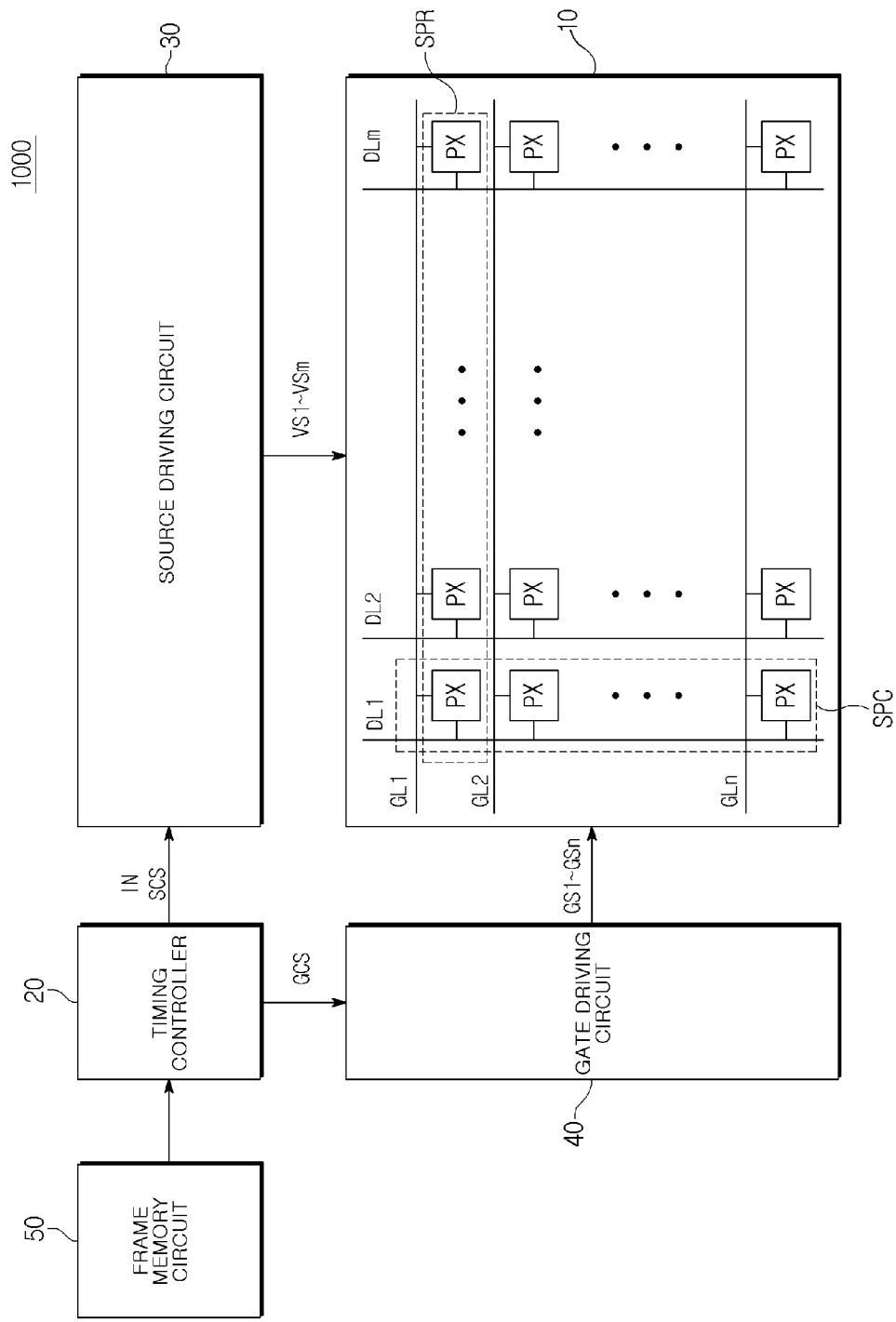
FIG. 1 shows a display device according to the present disclosure.

Various aspects of the present disclosure will be described in detail with reference to the accompanying drawings. The same or similar elements are denoted by the same reference numerals irrespective of the drawing numerals, and repetitive description thereof may be omitted.

A suffix "module" or "part" for the component, which is used in the following description, is given or mixed in consideration of only convenience for ease of specification, and does not have any distinguishing meaning or function per se. Also, the "module" or "part" may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some aspects of the present disclosure may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

While terms including ordinal numbers such as the first and the second, etc., can be used to describe various components, the components are not limited by the terms mentioned above. The terms are used only for distinguishing between one component and other components.

In the case where a component is referred to as being "connected" or "accessed" to another component, it should be understood that not only the component is directly connected or accessed to the other component, but also there may exist another component between them. Meanwhile, in the case where a component is referred to as being "directly connected" or "directly accessed" to another component, it should be understood that there is no component therebetween.

First, terms used in this specification will be described in brief.

SRAM is an abbreviation of "static random-access memory" and may be a memory capable of retaining stored data without any other operation as long as power is supplied.

CRC is an abbreviation of "cyclic redundancy check" and refers to a method for checking whether there is an error in transmitted data by using a CRC reminder obtained from a CRC calculation on the data.

FIG. 1 shows a display device according to the present disclosure. Referring to FIG. 1, a display device 1000 may display an image or video. For example, the display device 1000 may include a TV, a smart phone, a tablet personal computer (PC), a mobile phone, a video phone, an e-book reader, a computer, a camera, or a wearable device, etc., and is not limited thereto.

The display device 1000 may include a display panel 10, a timing controller 20, a source driving circuit 30, a gate driving circuit 40, and a frame memory circuit 50. According to the present disclosure, the gate driving circuit 40 may be implemented integrally with the display panel 10, and the timing controller 20 and the source driving circuit 30 may be referred to as a panel control circuit. However, the present disclosure is not limited thereto.

The display panel 10 may be configured to output an image or video. For example, the display panel 10 may be implemented with one of a liquid crystal display (LCD), a light emitting diode (LED) display, an organic LED (OLED) display, an active-matrix OLED (AMOLED) display, an electrochromic display (ECD), and a digital mirror device (DMD), an actuated mirror device (AMD), a grating light valve (GLV), a plasma display panel (PDP), an electro luminescent display (ELD), and a vacuum fluorescent display (VFD), and is not limited thereto.

The display panel 10 may include a plurality of subpixels PX which emit light. The plurality of subpixels PX may be arranged in rows and columns. For example, the plurality of subpixels PX may be arranged in a lattice structure composed of n rows and m columns (n and m being natural numbers). Here, rows in which the subpixels PX are arranged is referred to as a subpixel row (SPR), and columns in which the subpixels PX are arranged is referred to as a subpixel column (SPC). For example, with reference to FIG. 1, a first subpixel column, a second subpixel column, . . . , and an m-th sub-pixel column may be arranged from left to right.

The subpixels PX may be a basic unit in which light is emitted. Each of the subpixels PX may include a driving element. According to the present disclosure, light output from each of the subpixels PX may have one of red, green, and blue colors, and is not limited thereto. For example, white light may be output from the subpixel PX.

According to the present disclosure, the subpixels PX may include a light emitting device which is configured to output light and a pixel circuit which drives the light emitting device. The pixel circuit may include a plurality of switching elements, and the plurality of switching elements can control a driving voltage applied to the light emitting device and a flow of an image signal. For example, the light emitting device may be a light emitting diode (LED), an organic light emitting diode (OLED), a quantum dot LED (QLED), or a micro light emitting diode (micro LED). The aspects of the present disclosure are not limited to the foregoing types of the light emitting device.

The subpixels PX of the display panel 10 may be driven in units of a gate line (hereinafter, referred to as "line"). That is, the subpixels PX may be driven in units of the subpixel row. For example, the subpixels arranged in one gate line may be driven during a first period, and the subpixels arranged in another gate line may be driven during a second period following the first period. Here, a unit time period in which the subpixels PX are driven may be referred to as one horizontal (1H) time (or line) period.

The frame memory circuit 50 may include a frame memory, a memory controller which controls the frame memory, and a built-in self-test (BIST). The frame memory may temporarily store image data of one frame to be displayed on the display panel 10 and may transmit the image data to the timing controller 20 based on a control signal of the timing controller 20. A volatile memory such as a static random-access memory (SRAM) may be used as the frame memory. However, the frame memory is not limited thereto, and various types of memories can be used as the frame memory. The memory controller controls the overall operation of the frame memory, and in particular, can control an address and timing, etc., at which write and read operations on the frame memory are performed. The BIST may perform a self-test on the frame memory and detect and further repair failed cells.

The timing controller 20 may obtain the image data from the frame memory circuit 50, and appropriately process or convert the image data to generate an input data IN. The timing controller 20 may transmit the input data IN to the source driving circuit 30.

The timing controller 20 may receive an external control signal OCS from an external device. The external control signal may include an internal horizontal synchronization signal (Internal Hsync), an internal vertical synchronization signal (Internal Vsync), and a clock signal OCLK, and is not limited thereto.

The timing controller 20 may control operations of the source driving circuit 30 and the gate driving circuit 40 based on the external control signal OCS. According to the aspects, the timing controller 20 may receive the external control signal OCS, and may generate a source control signal SCS for controlling the source driving circuit 30, a gate control signal GCS for controlling the gate driving circuit 40, the internal vertical synchronization signal, and the internal horizontal synchronization signal.

The source driving circuit 30 may generate image signals VS1 to VSm corresponding to the image displayed on the display panel 10, based on the input data IN and the source control signal SCS, and may output the generated image signals VS1 to VSm to the display panel 10. According to the aspects, the source driving circuit 30 may generate the image signals VS1 to VSm with a voltage value corresponding to the input data IN.

The source driving circuit 30 may sequentially output the image signals VS1 to VSm to be output for each subpixel row of the display panel 10. According to the aspects, the source driving circuit 30 may provide, during the 1H time period, the image signals VS1 to VSm to be displayed in the 1H time period to the subpixels PX which are driven during the 1H time period. The image signals VS1 to VSm output from the source driving circuit 30 may be transmitted to each of the subpixels PX through data lines DL1 to DLm of the display panel 10.

The gate driving circuit 40 may sequentially output a plurality of gate signals GS1 to GSn in response to the gate control signal GCS.

Each of the gate signals GS1 to GSn is for turning on the subpixels PX connected respectively to gate lines GL1 to GLn, and may be applied to a gate terminal of a transistor included in each of the subpixels PX. According to the aspects, each of the gate signals GS1 to GSn may include at least one of a scan signal, a light emission signal, and an initialization signal.

According to the present disclosure, at least two of the timing controller 20, the source driving circuit 30, and the gate driving circuit 40 may be implemented as one integrated circuit. Alternatively, the timing controller 20, the source driving circuit 30, and the gate driving circuit 40 may be implemented by being mounted on the display panel 10.

In the present disclosure, an SRAM dynamic failure handling system is proposed. The SRAM dynamic failure handling system proposed may be used instead of the frame memory circuit 50 of the display device 1000 shown in FIG. 1. However, the use of the SRAM dynamic failure handling system is not limited thereto. The SRAM dynamic failure handling system proposed in the present disclosure can be provided in any device using the SRAM, and accordingly, can dynamically perform a function of detecting and repairing a failed SRAM cell.

Figure 2:
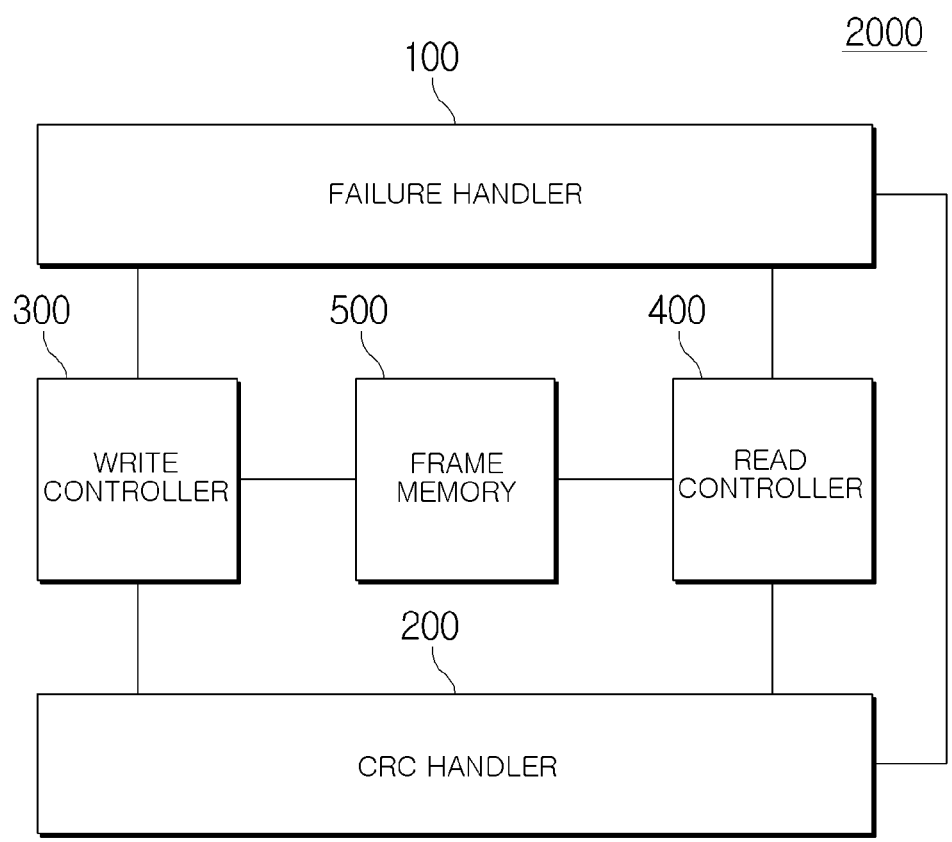
FIG. 2 is a block diagram showing schematically an SRAM dynamic failure handling system according to the present disclosure.
Figure 3:
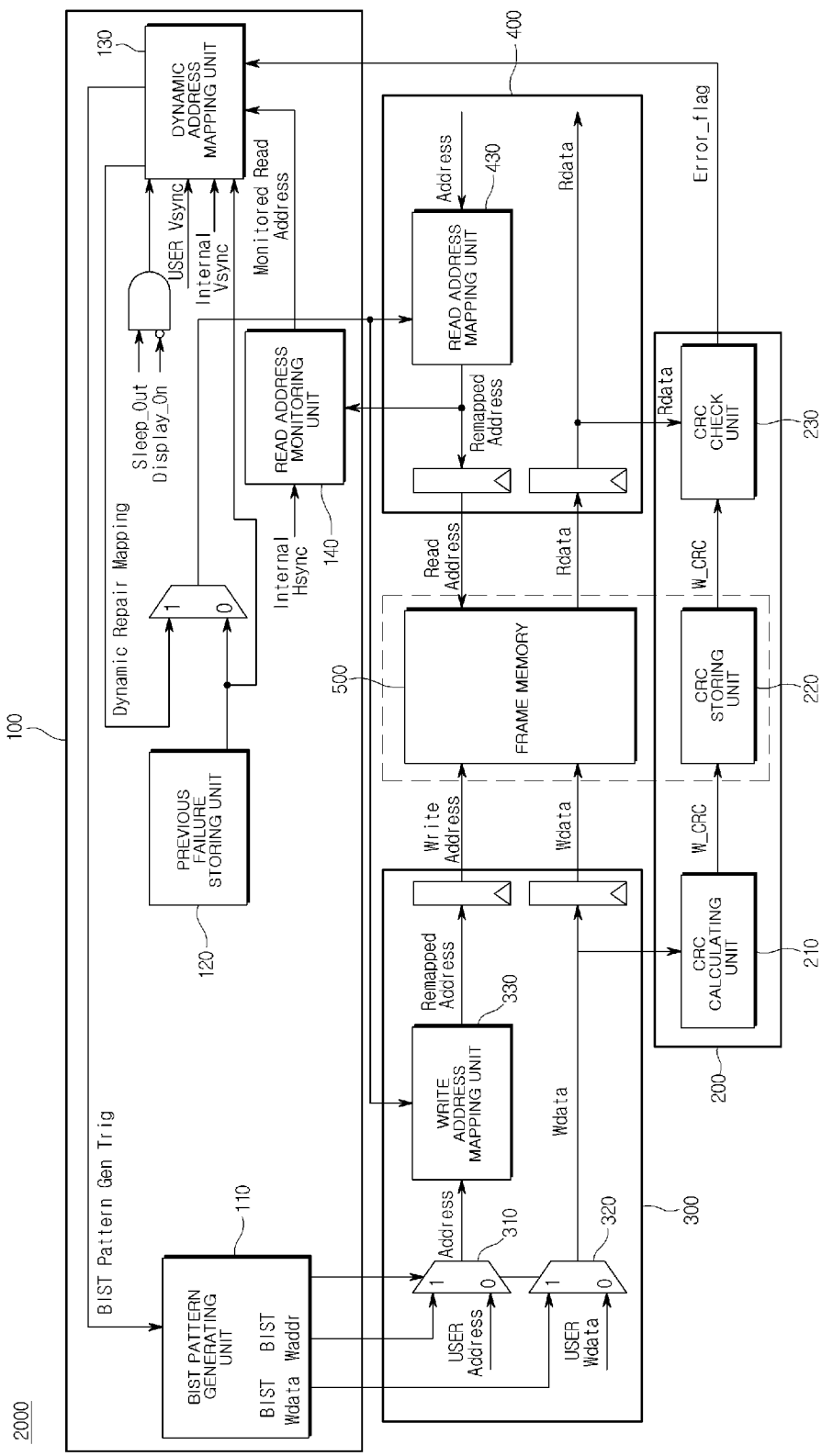
FIG. 3 is a detailed block diagram showing the SRAM dynamic failure handling system according to the present disclosure.

FIG. 2 is a block diagram showing schematically the SRAM dynamic failure handling system 2000 according to the present disclosure. FIG. 3 is a detailed block diagram showing the SRAM dynamic failure handling system 2000 according to various aspects of the present disclosure.

Referring to FIG. 2, the SRAM dynamic failure handling system may include a failure handler 100, a CRC handler 200, a write controller 300, a read controller 400, and a frame memory 500.

A volatile memory such as a static random-access memory (SRAM) may be used as the frame memory 500.

Figure 4:
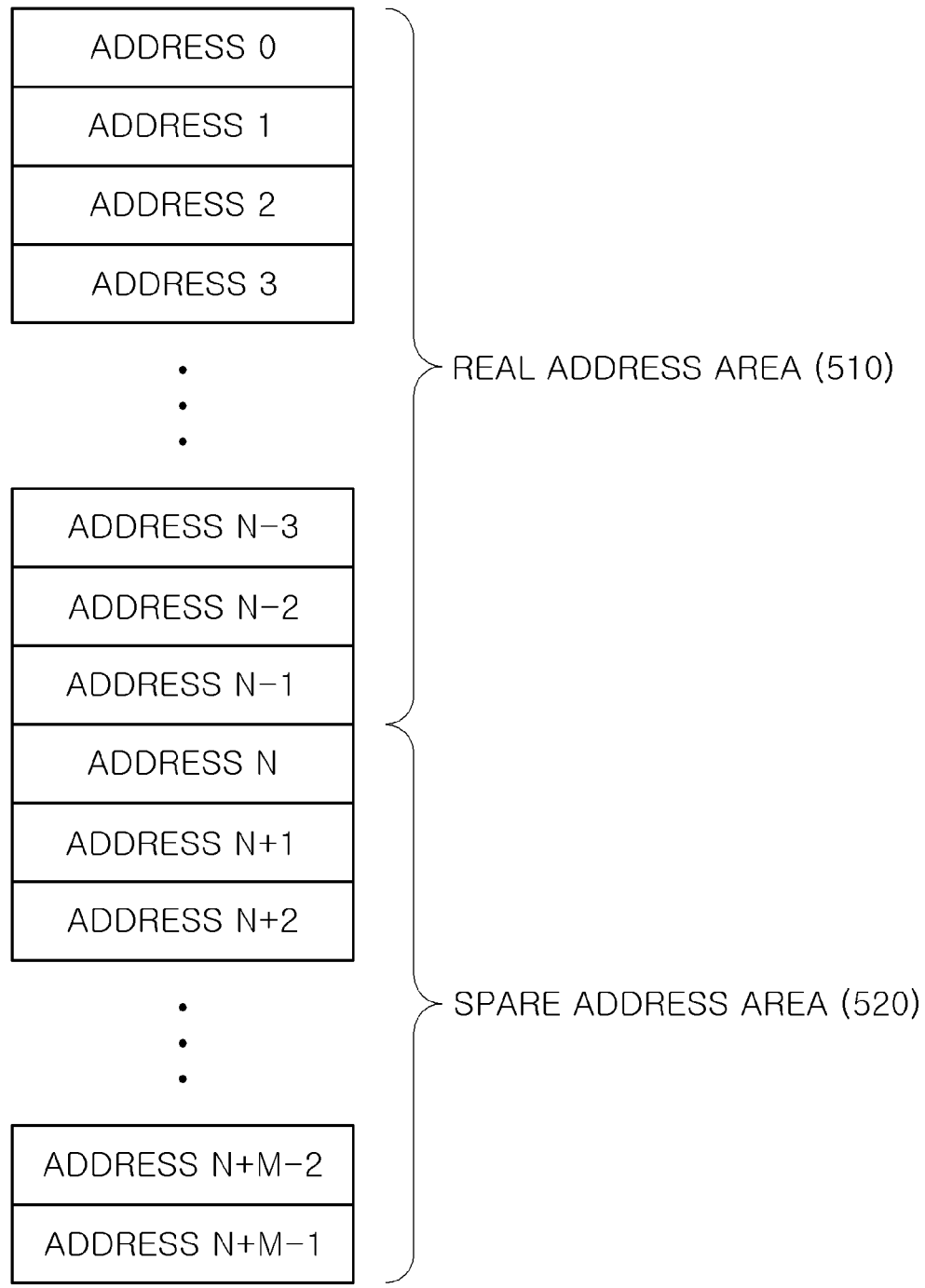
FIG. 4 shows an example of an address range of a frame memory.

FIG. 4 shows an example of an address range of the frame memory 500.

Referring to FIG. 4, the frame memory 500 may include a real address area 510 and a spare address area 520. The real address area 510 is set such that an actual frame data is written. When at least one of the SRAM cells of a corresponding address in the real address has a fault address, the spare address area 520 can be used instead of the fault address. Referring to FIG. 4, the real address area 510 may include N number of address areas from addresses 0 to N−1, and the spare address area 520 may include M number of address areas from addresses N to N+M−1. For example, if a failure occurs in the SRAM cell belonging to an address N−3, the address N−3 becomes a fault address, and data to be written to the address N−3 may be written to one of the addresses of the spare address area 520 instead of the address N-3. As such, by providing the spare address area 520, the frame memory 500 or a device using the frame memory 500 can be continuously used through repair, even though a failure occurs in some of the SRAM cells.

Referring back to FIG. 2, the write controller 300 may generate a signal for storing data in the frame memory 500 and store the data in the frame memory 500. According to an aspect, the write controller 300 may transmit, to the frame memory 500, a write data Wdata and an address (Write Address) signal for writing the write data, so that the data can be stored at the address of the frame memory 500.

When an external device such as the timing controller 20 requests data of the frame memory 500, the read controller 400 may generate a read address (Read Address) based on the address transmitted from the external device and output to the frame memory 500, and may obtain a read data Rdata from the frame memory 500.

Here, the write controller 300 and the read controller 400 may generate an address for writing to the frame memory 500 or for reading from the frame memory 500, based on a newly mapped fault address mapping information obtained by being handled by the failure handler 100. Accordingly, the write controller 300 and the read controller 400 do not use the requested address as it is, and may map the address of the fault cell to the address mapped based on the handling of the failure handler 100, and may transmit the mapped address to the frame memory 500.

The CRC handler 200 may generate a CRC reminder W_CRC obtained from a CRC calculation on the data Wdata to be written to the frame memory 500 by the write controller 300, may store the CRC reminder W_CRC in a CRC storing unit 220, may obtain a CRC reminder obtained from a CRC calculation on a combination of the read data Rdata obtained from the frame memory 500 by the read controller 400 and the CRC reminder W_CRC obtained from the CRC storing unit 220, and may transmit CRC error information to the failure handler 100 if the CRC reminder is not 0. Alternatively, the CRC handler 200 may transmit, to the failure handler 100, a CRC error information when a CRC reminder R_CRC obtained from a CRC calculation on the data Rdata obtained from the frame memory 500 is not coincided with the CRC reminder W_CRC obtained from the CRC storing unit 220.

The present disclosure proposes a method for dynamically recognizing a failure of a memory cell in the frame memory 500. The method is based on a CRC remainder obtained from a CRC calculation on a combination of the read data Rdata obtained from the frame memory 500 by the read controller 400 and the CRC remainder W_CRC which is stored when the data is written at the frame memory 500. In another example, the method is based on the result obtained by comparing the CRC remainder W_CRC which is stored at the CRC storing unit 220 and a CRC reminder obtained from a CRC calculation on the read data Rdata obtained from the frame memory 500.

The failure handler 100 may determine whether there is a failure in the SRAM cell for specific addresses of the frame memory 500 based on the CRC error information, received from the CRC handler 200, which indicates there is a difference between the written data to the frame memory 500 and the read data from the frame memory 500. If there is a failure, the failure handler 100 maps the corresponding address to another non-fault address having non-fault, so that the external device may consider that the corresponding address has non-fault.

Each block of a SRAM dynamic failure handling system 2000 will be described in more detail based on FIG. 3.

Referring to FIG. 3, the write controller 300 may include a first multiplexer (MUX) 310, a second multiplexer (MUX) 320, and a write address mapping unit 330.

The first MUX 310 may determine an output address (Address) by selecting one of a user address (USER address) and a BIST address (BIST Waddr), and the second MUX 320 may determine the write data Wdata by selecting and outputting one of a user data (USER Wdata) and a BIST data (BIST Wdata). Here, the user address (USER Address) and the user data (USER Wdata) may be signals for temporarily storing an actually used data (e.g., image data or still data displayed on the display panel 10 of the display device) in the frame memory 500. Also, the BIST address (BIST Waddr) and the BIST data (BIST Wdata) may be an address and a data that the failure handler 100 provides during the BIST in order to recognize a failed cell of the frame memory 500.

The first MUX 310 and the second MUX 320 may determine which address and data to output based on a signal (e.g., BISTPathEnable) provided by the failure handler 100. The BIST may be performed before power is supplied to the display device 1000 and the display panel 10 of the display device 1000 normally operates. Accordingly, the first MUX 310 and the second MUX 320 of the write controller 300 may receive, from the failure handler 100, and use the signal (BISTPathEnable) which enables the BIST address (BIST Waddr) and the BIST data (BIST Wdata) to be output during the BIST and enables the user address (USER Address) and the user data (USER Wdata) to be output during a normal operation instead of the BIST.

The write address mapping unit 330 may obtain, from the failure handler 100, fault address mapping information which maps a fault address to a non-fault address. According to the aspect, the write address mapping unit 330 may generate and store a mapping table based on the obtained fault address mapping information. Then, the write address mapping unit 330 determines whether the output address (Address) output from the first MUX 310 is a fault address or a non-fault address. When the output address is a fault address, the write address mapping unit 330 may output the non-fault address mapped based on the fault address mapping information or the mapping table, and when the output address is a non-fault address, the write address mapping unit 330 may output the output address (Address) as it is. The address output from the write address mapping unit 330 may be a location at which the write data Wdata is stored in the frame memory 500. The address output from the write address mapping unit 330 by the above-described operation may be determined as a non-fault address in the current state.

The write data Wdata output from the second MUX 320 may be transmitted to the frame memory 500. At the same time, the write data Wdata output from the second MUX 320 may be transmitted to the CRC handler 200 and a CRC remainder may be calculated and stored.

The write controller 300 may selectively transmit a write address (Write Address) and the write data Wdata to the frame memory 500 via a buffer.

The read controller 400 may include a read address mapping unit 430.

The read address mapping unit 430 may obtain, from the failure handler 100, fault address mapping information which maps a fault address to a non-fault address. According to the aspect, the read address mapping unit 430 may generate and store a mapping table based on the obtained fault address mapping information. The mapping tables generated by the write address mapping unit 330 and the read address mapping unit 430 may be the same.

Then, the read address mapping unit 430 determines whether an address (Address) input from an external device is a fault address or a non-fault address. When the address (Address) is a fault address, the read address mapping unit 430 may output the non-fault address mapped based on the fault address mapping information or the mapping table, and when the address (Address) is a non-fault address, the read address mapping unit 430 may output the address (Address) as it is. The read address (Read Address) output from the read address mapping unit 430 may be a location at which the read data Rdata is read in the frame memory 500. The address output from the read address mapping unit 430 by the above-described operation may be determined as a non-fault address in the current state.

Also, when it is determined that a failure occurs in the cell of the frame memory 500 included in the corresponding address, the address output from the read address mapping unit 430 may be provided later to the failure handler 100 in order to recognize the fault address.

The read controller 400 may selectively transmit the read address (Read Address) to the frame memory 500 via a buffer. The read controller 400 may also obtain the read data Rdata of the corresponding address from the frame memory 500 via the buffer.

The read data Rdata obtained by the read controller 400 from the frame memory 500 may be transmitted to an external device (e.g., the timing controller 20). At the same time, the read data Rdata obtained from the frame memory 500 is transmitted to the CRC handler 200. The CRC handler 200 may generate a CRC remainder by performing CRC calculation on the combination of the read data Rdata and the CRC remainder W_CRC stored at the CRC storing unit 220, or alternatively, the CRC handler 200 may compares the CRC remainder W_CRC stored at the CRC storing unit 220 with a CRC remainder obtained from a CRC calculation on the read data Rdata.

The CRC handler 200 may include a CRC calculating unit 210, the CRC storing unit 220, and a CRC check unit 230.

The CRC calculating unit 210 may generate a CRC remainder W_CRC with respect to the write data Wdata. According to the aspect, the CRC calculating unit 210 may generate the CRC remainder W_CRC by dividing the write data Wdata by a predetermined divisor. The CRC calculating unit 210 may store the generated CRC remainder W_CRC in the CRC storing unit 220.

The CRC storing unit 220 may store the CRC remainder W_CRC generated by the CRC calculating unit 210, and may provide the stored CRC remainder W_CRC to the CRC check unit 230. The CRC storing unit 220 may be included in the frame memory 500 or may be a separate storage. According to the aspect, the CRC storing unit 220 may be a first in first out (FIFO) memory. In general, the FIFO memory can be used because the order of addresses in which data is written to the frame memory 500 and the order of addresses in which data is read from the frame memory 500 are the same. According to another aspect, the CRC storing unit 220 may be a SRAM, and may store the calculated CRC remainder W_CRC at an address corresponding to the address at which the write data Wdata is stored.

The CRC check unit 230 may check whether a CRC error has occurred, by using the read data Rdata obtained from the frame memory 500 and the CRC remainder W_CRC read from the CRC storing unit 220. For example, when a value obtained by combining the read data Rdata with the CRC remainder W_CRC in serial is divided by the same divisor that the CRC calculating unit 2, and if a CRC remainder of this calculation is 0, the CRC check unit 230 may determine that no CRC error has occurred, and if the CRC remainder is not 0, the CRC check unit 230 may determine that a CRC error has occurred. According to another aspect, the CRC check unit 230 may generate a CRC remainder R_CRC by performing CRC calculation on the read data Rdata. When the CRC remainder R_CRC is compared with the CRC remainder W_CRC, if they are the same as each other, the CRC check unit 230 may determine that no CRC error has occurred, and if they are not the same, the CRC check unit 230 may determine that the CRC error has occurred.

When the CRC error occurs, the CRC check unit 230 may generate an error flag Error_flag and provide it to the failure handler 100.

The failure handler 100 may include a BIST pattern generating unit 110, a pre-failure storing unit 120, a dynamic address mapping unit 130, and a read address monitoring unit 140.

When a pattern generation signal (BIST Pattern Gen Trig) is input to the BIST pattern generating unit 110, the BIST pattern generating unit 110 may create a data pattern to be written to each address of the frame memory 500, by using a built-in self-test (BIST) test pattern on the entire SRAM cell. According to the aspect, the BIST pattern generating unit 110 may generate the BIST address (BIST Waddr) of the frame memory 500 and the BIST data (BIST Wdata) to be written to the corresponding address and transmit them to the write controller 300.

According to the aspect, the pattern generation signal (BIST Pattern Gen Trig) may be generated by the dynamic address mapping unit 130, but is not limited thereto. The BIST pattern generating unit 110 may generate the pattern generation signal (BIST Pattern Gen Trig) by itself. According to another aspect, the pattern generation signal (BIST Pattern Gen Trig) may be generated in another block not shown in FIG. 3.

The BIST can be performed in a period from a point of time when power is supplied to the system or a command to exit a sleep state in the sleep state is received until the display panel 10 starts displaying an image. Therefore, according to the aspect, the pattern generation signal (BIST Pattern Gen Trig) may be generated in a period from a point of time when power is supplied to the system or a sleep-out signal which means that the system exits the sleep state and starts operation is generated until a signal Display_On which means that the display panel 10 is driven is generated.

The pre-failure storing unit 120 may provide a pre-stored fault address and repair information based on a result of a pre-failure test performed before shipment. According to the aspect, the pre-failure storing unit 120 may include a one-time programming (OTP) memory and a controller which includes command registers capable of performing access control on the OTP memory. According to the aspect, the controller may obtain data by accessing the OTP based on a value written to the command register by an external control device and transmit the data to the external control device. According to another aspect, when power is supplied, the controller may automatically access the OTP based on a value written in advance in the command register and may obtain data and transmit the data to the external control device. Here, the external control device may be the dynamic address mapping unit 130.

The technology proposed in the present disclosure can actively check that a failure occurs in the SRAM cell belonging to the real address, that is to say, since the technology can check an actual image data while writing and reading the actual image data to and from the frame memory 500 and accordingly does not necessarily need to know in advance fault real address information the foregoing pre-failure storing unit 120 may be optionally provided. According to the aspect, the pre-failure storing unit 120 may not be provided, and according to another aspect, the pre-failure storing unit 120 may be provided. Also, even though the pre-failure storing unit 120 is provided, the pre-failure storing unit 120 may include only fault address information or may include the fault address information and repair information. Also, the fault address information may include fault real address information and fault spare address information.

The read address monitoring unit 140 may monitor an address used to read data from the frame memory 500. When the error flag Error_flag occurs because of the CRC error between the written data to the frame memory 500 and the read data from the frame memory 500, the fault address associated with the corresponding error flag can be recognized based on the address obtained by the read address monitoring unit 140. To this end, the read address monitoring unit 140 may provide the monitored read address to the dynamic address mapping unit 130.

The read address monitoring unit 140 may monitor and collect read addresses for read data associated with CRC error. In the case of the display device 1000 shown in FIG. 1, for example, if the CRC is generated in units of data corresponding to one horizontal line, the read addresses are used in order to read data corresponding to the one horizontal line from the frame memory 500. Accordingly, the read address monitoring unit 140 latches the read addresses (Read address) in accordance with the internal horizontal synchronization signal (Internal Hsync), thereby monitoring the addresses of the frame memory 500 from which the current data is read.

The addresses collected by the read address monitoring unit 140 may be a non-fault address after mapping the fault address to the non-fault address by the read address mapping unit 430.

The dynamic address mapping unit 130 may determine whether the obtained fault address is a real address of the real address area 510 or a spare address of the spare address area 520, based on the fault address information provided from the pre-failure storing unit 120 or the monitored read address (Monitored Read Address) provided from the read address monitoring unit 140 and the error flag (Error_flag) provided from the CRC check unit 230, and may dynamically map the spare address within the spare address area 520 to the fault address of the real address area 510. In the present specification, the real address in which the CRC error occurs is referred to as a fault real address, and the spare address in which the CRC error occurs is referred to as a fault spare address.

FIGS. 5 to 10 are schematic views for describing the operation of mapping the fault address of the dynamic address mapping unit 130 to the non-fault spare address.

Referring to FIG. 5, the dynamic address mapping unit 130 may include a fault real address unit 131 and a non-fault spare address unit 132. The fault real address unit 131 and the non-fault spare address unit 132 may include the fault real address information and address information on the non-fault address without fault among spare addresses, respectively. According to the aspect, the fault real address unit 131 and the non-fault spare address unit 132 may store the amount of address information equal to the number of addresses (e.g., M shown in FIG. 4) included in the spare address area 520. If the number of fault real addresses exceeds the number of spare addresses, a corresponding product must be discarded because all fault real addresses cannot be replaced with the spare addresses. Accordingly, even if the number of real addresses is greater than M, it can be sufficient if the number of addresses that the fault real address unit 131 can store is the number of spare addresses.

FIG. 5 shows initial values of the fault real address unit 131 and the non-fault spare address unit 132. In the example of FIG. 5, the spare address area 520 may include eight addresses from an address 0x8000 to an address 0x8007. Accordingly, the fault real address unit 131 and the non-fault spare address unit 132 may store eight addresses.

All the registers or memories of the fault real address unit 131 may initially store "0xFFFF". "0xFFFF" is an invalid address and may indicate that there is non-fault address. The non-fault spare address unit 132 may store all the spare addresses of the spare address area 520. This is because all the spare addresses in the spare address area 520 can be initially regarded as non-fault addresses.

Thereafter, the dynamic address mapping unit 130 may update the fault real address unit 131 by using the fault address information stored in the pre-failure storing unit 120 and by using the read address collected in the read address monitoring unit 140 when the error flag is received from the CRC handler 200.

FIG. 6 shows an example of updating the fault real address unit 131.

The dynamic address mapping unit 130 may update the fault real address unit 131 based on the fault real address information obtained by the pre-failure storing unit 120. Then, the dynamic address mapping unit 130 may update the fault real address unit 131 based on fault real address information collected in the read address monitoring unit 140 when an fault address is determined based on a result of checking the CRC calculation result of the write data and read data by the CRC handler 200. Here, the fault real address unit 131 may be initialized as a value indicating an invalid address such as "0xFFFF". For one example for description, it is assumed that "0x0080" is stored as a fault real address in the pre-failure storing unit 120 and that a fault has occurred at the real addresses "0x0006" and "0x0080" through the CRC check during the normal operation or during the BIST.

The dynamic address mapping unit 130 may receive the above-described fault real address information, and may update the fault real address unit 131 as shown in FIG. 6.

Referring to FIG. 6, in the state where the fault real address unit 131 is initialized as shown in (a), when the dynamic address mapping unit 130 obtains "0x0080" as the fault real address from the pre-failure storing unit 120 or from both the CRC handler 200 and the read address monitoring unit 140, the dynamic address mapping unit 130 may store the corresponding address in a first position of the fault real address unit 131 as shown in (b).

Also, when the dynamic address mapping unit 130 obtains "0x0006" as the fault real address, the dynamic address mapping unit 130 may store the corresponding address in a second position of the fault real address unit 131 as shown in (c). Here, the dynamic address mapping unit 130 compares the obtained fault real address "0x0006" with stored values from the first position to the last position, and when the same address is stored, the same address may not be repeatedly stored. In this case, since an address which is the same as the fault real address "0x0006" is not stored, the corresponding address can be stored in the second position.

When the dynamic address mapping unit 130 obtains "0x0080" as the fault real address, the dynamic address mapping unit 130 compares the obtained fault real address "0x0080" with stored values from the first position to the last position. When the same address is stored, the same address may not be repeatedly stored. In this case, since the same address is stored in the first position, no additional update is required, and the fault real address unit 131 may be, as shown in (d), the same as the fault real address unit 131 shown in (c).

As such, the dynamic address mapping unit 130 checks whether the same address is stored in the fault real address unit 131 every time the dynamic address mapping unit 130 obtains the fault real address, and can add the corresponding address to the fault real address unit 131 only when the same address is not stored.

Figure 7:
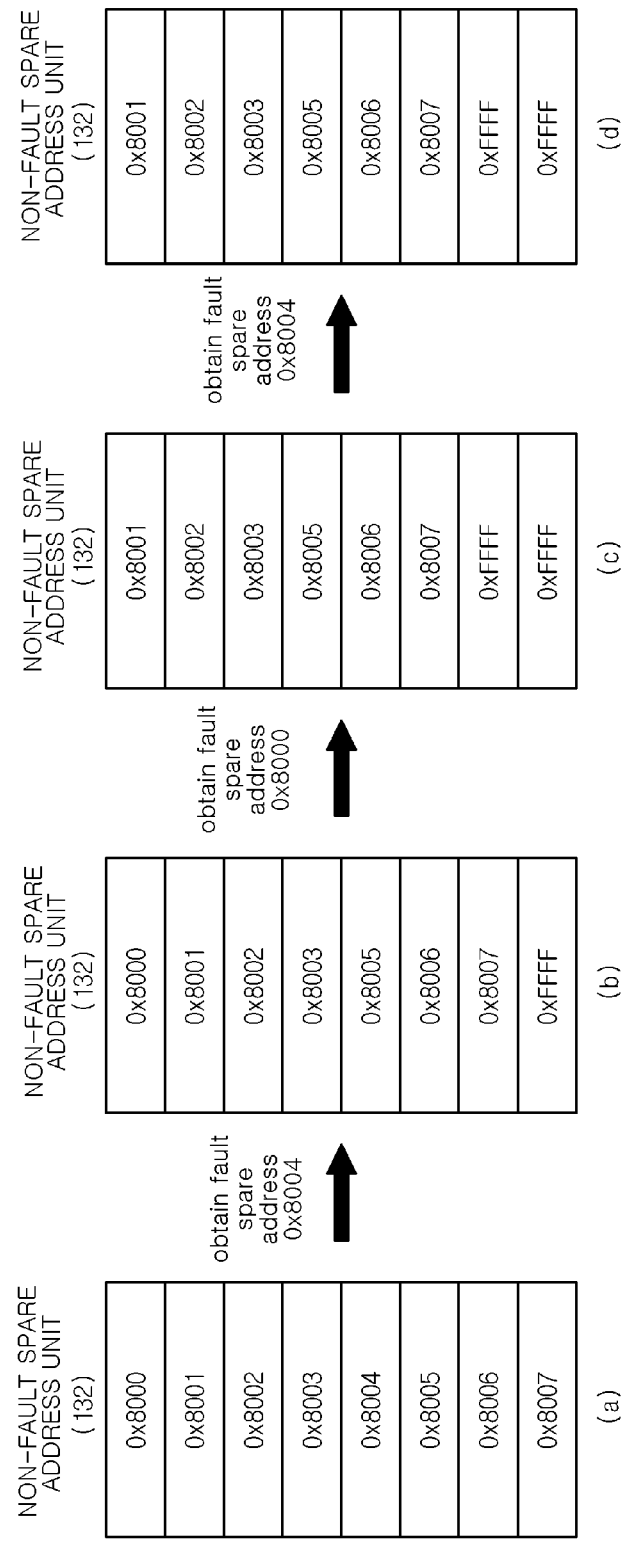
FIG. 7 shows an example of updating the non-fault spare address unit 132.

FIG. 7 shows an example of updating the non-fault spare address unit 132.

The dynamic address mapping unit 130 may update the non-fault spare address unit 132 based on the fault spare address information obtained by the pre-failure storing unit 120. Then, the dynamic address mapping unit 130 may update the non-fault spare address unit 132 based on fault spare address information collected in the read address monitoring unit 140 when fault address is determined based on a result of checking the CRC calculation result of the write data and read data by the CRC handler 200. Here, the non-fault spare address unit 132 may be initialized to addresses representing the non-fault spare addresses. For one example for description, it is assumed that "0x8004" is stored as a fault spare address in the pre-failure storing unit 120 and that a fault has occurred at the spare addresses "0x8000" and "0x8004" through the CRC check during the operation or during the BIST.

The dynamic address mapping unit 130 may receive the above-described fault spare address information, and may update the non-fault spare address unit 132 as shown in FIG. 7.

Referring to FIG. 7, in the state where the non-fault spare address unit 132 is initialized as shown in (a), when the dynamic address mapping unit 130 obtains "0x8004" as the fault spare address from the pre-failure storing unit 120 or from both the CRC handler 200 and the read address monitoring unit 140, the dynamic address mapping unit 130 compares "0x8004" with the values sequentially written from the first position of the non-fault spare address unit 132 to check whether "0x8004" is written. When it is checked, as shown in (a), that "0x8004" is written in a fifth position of the non-fault spare address unit 132, "0x8004" written in the fifth position of the non-fault spare address unit 132 is, as shown in (b), deleted, and the subsequent non-fault spare addresses are moved one by one and written. Also, an address that does not fall within the address range, that is, an invalid address "0xFFFF" is written at the last position. By performing such an operation, the dynamic address mapping unit 130 may allow the non-fault spare address to be continuously written from in the first position of the non-fault spare address unit 132 while deleting the fault spare address from the non-fault spare address unit 132 When the invalid address "0xFFFF" is encountered, the dynamic address mapping unit 130 may indicate that no more non-fault spare addresses are written.

Also, when the dynamic address mapping unit 130 obtains "0x8000" as the fault spare address, the dynamic address mapping unit 130 compares "0x8000" with the values sequentially written from the first position of the non-fault spare address unit 132 to check whether "0x8000" is written. When it is checked, as shown in (b), that "0x8000" is written in the first position of the non-fault spare address unit 132, the corresponding address value written in the first position of the non-fault spare address unit 132 is, as shown in (c), deleted, and the subsequent written values are moved one by one and written. Also, an invalid address "0xFFFF" is written at the last position. By performing such an operation, the dynamic address mapping unit 130 may allow the non-fault spare address to be continuously adjacently written from in the first position of the non-fault spare address unit 132 while deleting the fault spare address from the non-fault spare address unit 132 When the invalid address "0xFFFF" is encountered, the dynamic address mapping unit 130 may indicate that no more non-fault spare addresses are written.

When the dynamic address mapping unit 130 obtains "0x8004" as the fault spare address, the dynamic address mapping unit 130 compares "0x8004" with the values sequentially written from the first position of the non-fault spare address unit 132 to check whether "0x8004" is written. Referring to (c), when the position where "0x8004" is written cannot be found and "0xFFFF" indicating that there are no more non-fault spare addresses is obtained, the corresponding address has already been deleted from the non-fault spare address unit 132, and thus, no additional update is required, and the non-fault spare address unit 132 may be, as shown in (d), the same as the non-fault spare address unit 132 shown in (c).

As such, the dynamic address mapping unit 130 checks whether the same address is stored in the non-fault spare address unit 132 every time the dynamic address mapping unit 130 obtains the fault spare address, and can delete the corresponding address from the non-fault spare address unit 132 only when the same address is stored.

The dynamic address mapping unit 130 may map the fault real address to the non-fault spare address based on the updated fault real address unit 131 and the updated non-fault spare address unit 132.

Figure 8:
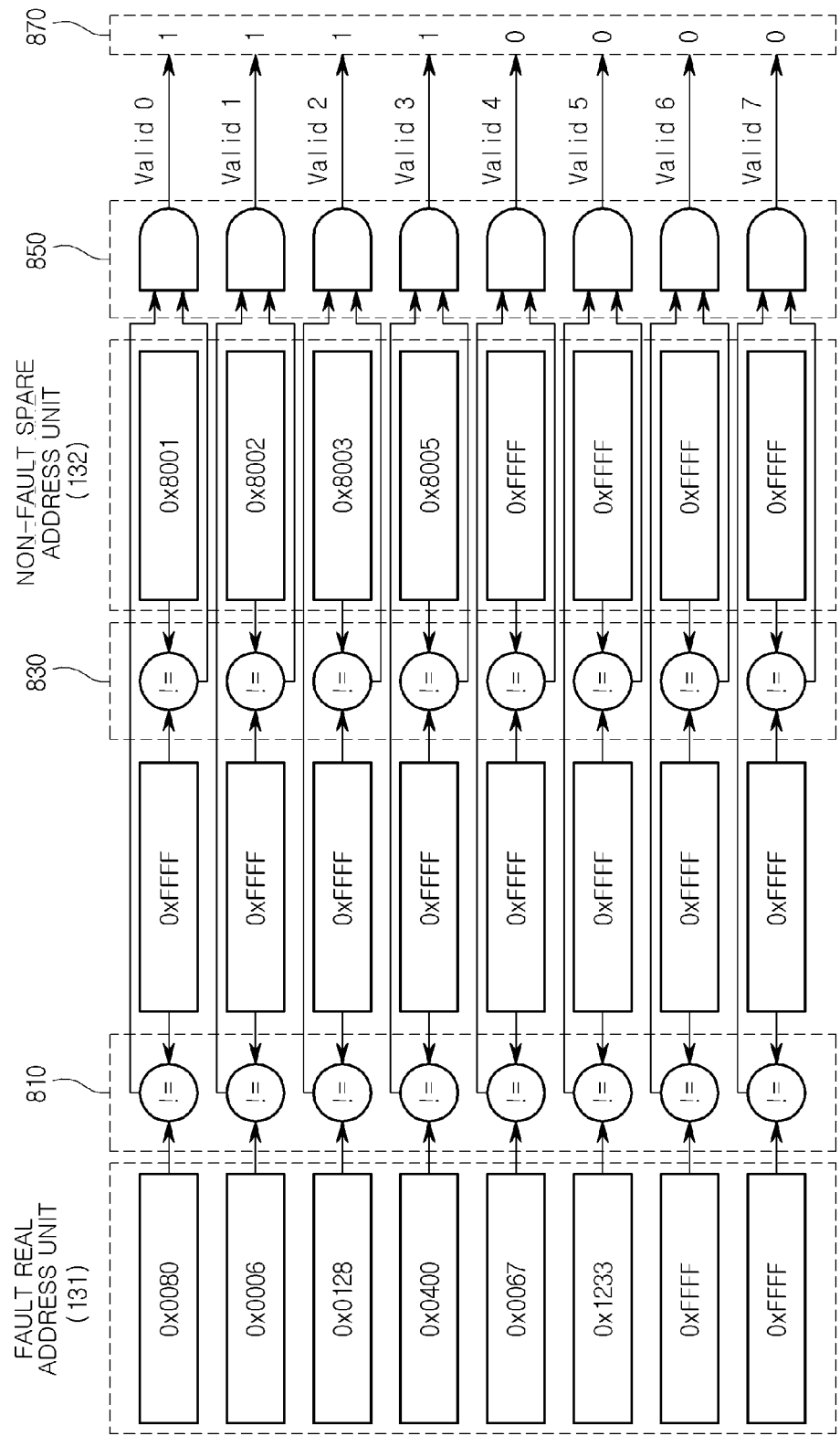
FIG. 8 shows an example in which a dynamic address mapping unit 130 maps the fault real address to the non-fault spare address based on the updated fault real address unit 131 and the updated non-fault spare address unit 132.

FIG. 8 shows an example in which the dynamic address mapping unit 130 maps the fault real address to the non-fault spare address based on the updated fault real address unit 131 and the updated non-fault spare address unit 132.

Referring to FIG. 8, the dynamic address mapping unit 130 determines whether the value stored in each position of the fault real address unit 131 matches the invalid address "0xFFFF" (810). If they match, a logical value "0" may be output, and when they do not match, a logical value "1" may be output. The meaning of the logical value "1" may indicate that there is a fault real address in the corresponding position.

Also, the dynamic address mapping unit 130 determines whether the value stored in each position of the non-fault spare address unit 132 matches the invalid address "0xFFFF" (830). If they match, a logical value "0" may be output, and when they do not match, a logical value "1" may be output. Here, the meaning of the logical value "1" may indicate that there is a non-fault spare address in the corresponding position.

Also, the dynamic address mapping unit 130 performs an "AND operation" (850) on the logical values output from the same position. When the logical values are all "1", the dynamic address mapping unit 130 may output a mapping logical value (870) as "1" in response to the corresponding position. When one or two of the logical values output from the same position is "0", the dynamic address mapping unit 130 may output the mapping logical value as "0" in response to the corresponding position. Here, when the mapping logical value is "1", it means that the dynamic address mapping unit 130 maps the fault real address at the corresponding position of the fault real address unit 131 to the non-fault spare address at the corresponding position of the non-fault spare address unit 132.

Referring to the example of FIG. 8, the final output mapping logical values are "1" from the first position to the fourth position, which means that the fault real addresses in these four positions are mapped to the non-fault spare address. On the other hand, while the fault real addresses are in the fifth and sixth positions, there is no non-fault spare address to map them. This means that mapping cannot be performed.

Figure 9:
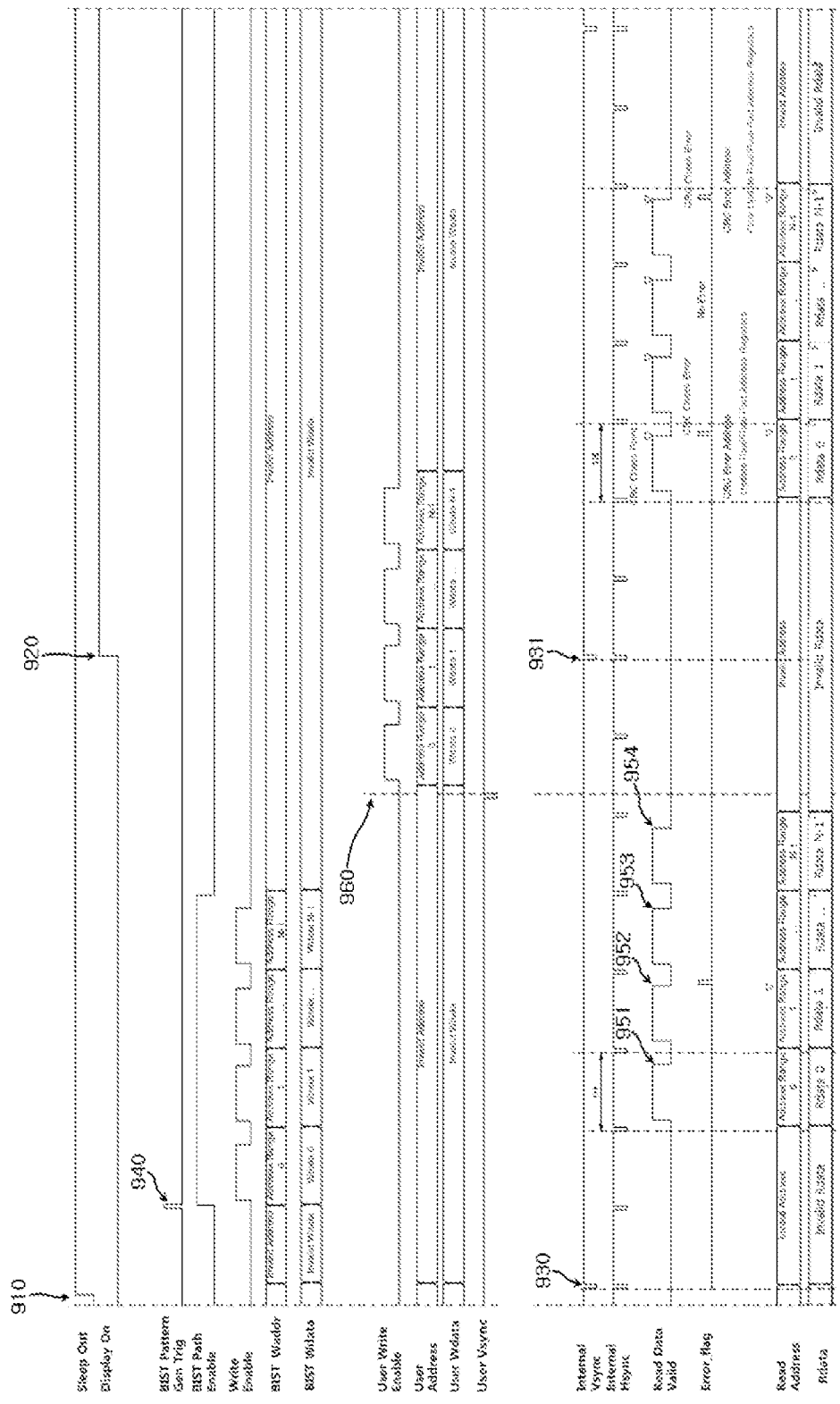
FIG. 9 is a timing diagram showing an example of describing the operation of an SRAM dynamic failure handling system 2000.

FIG. 9 is a timing diagram showing an example of describing the operation of the SRAM dynamic failure handling system 2000.

FIG. 9 shows an operation immediately after power is applied to the SRAM dynamic failure handling system 2000 or the system 2000 exits the sleep state by a control command.

Referring to FIG. 9, a signal "Sleep out" indicates that the SRAM dynamic failure handling system 2000 is powered on or has exited the sleep state by a control command. The signal "Sleep out" indicates that the system becomes a state of "sleep out" at a time point 910.

A signal "Display On" indicates a time point when the display panel 10 operates. In the example of FIG. 9, the signal "Display On" indicates that the display panel 10 operates at a time point 920.

Referring to FIG. 9, the signal (BIST Pattern Gen Trig) may be generated in order that the BIST pattern generating unit 110 generates BIST test data at a time point 940 after the signal "Sleep out" is generated. Upon receiving the corresponding signal, the BIST pattern generating unit 110 may generate the BIST address (BIST Waddr) and the BIST data (BIST Wdata) and transmit them to the write controller 300. Here, a signal (BIST Path Enable) may be transmitted together such that the BIST address and the BIST data can be output from the first MUX 310 and the second MUX 320 of the write controller 300. A signal (Write Enable) shown in FIG. 9 may be a signal for writing the BIST data to the frame memory 500. The BIST address and the BIST data may be valid only when the signal (Write Enable) is a logic "1" (high).

The internal vertical synchronization signal (Internal Vsync), the internal horizontal synchronization signal (Internal Hsync), and a read data valid signal (Read Data Valid) shown in the example of FIG. 9 may be controlled by an external device (e.g., the timing controller 20 or other synchronization signal generation module) in order to transmit the image data stored in the frame memory 500 to the timing controller 20. The read controller 400 of the SRAM dynamic failure handling system 2000 may receive the read address (Read Address) generated in a timing relationship diagram with the above-described signals, may read the read data Rdata corresponding thereto from the frame memory 500, and may transmit the read data Rdata to the external device (e.g., the timing controller 20).

The dynamic address mapping unit 130 may obtain a fault address for dynamic address mapping based on time points 930 and 931 at which the internal vertical synchronization signal (Internal Vsync) is generated. In the example of FIG. 9, the read controller 400 may read the data of the frame memory 500 by increasing the address by 1 based on the internal horizontal synchronization signal (Internal Hsync) generated after the internal vertical synchronization signal (Internal Vsync) is generated. When the CRC remainder obtained from a CRC calculation on the combination of the read data Rdata and the CRC remainder W_CRC is not 0 or when the CRC remainder R_CRC obtained from a CRC calculation on the read data Rdata and the CRC remainder W_CRC obtained from a CRC calculation on the write data Wdata are different from each other, the CRC handler 200 may generate the error flag and transmit it to the dynamic address mapping unit 130. Accordingly, the dynamic address mapping unit 130 can obtain the fault address in a period due to the CRC error of reading data from the frame memory 500. Accordingly, the dynamic address mapping unit 130 can obtain a fault address for dynamic address mapping, based on the time point when the CRC error for the read data occurs and of time points 930 and 931 at which the internal vertical synchronization signal (Internal Vsync) is generated.

Meanwhile, at the time point 930 when the internal vertical synchronization signal (Internal Vsync) is first generated, the dynamic address mapping unit 130 may selectively transmit the result of mapping the fault real address to the non-fault spare address to the write address mapping unit 330 of the write controller 300 and to the read address mapping unit 430 of the read controller 400. Here, the mapping result may be based only on the fault real address information and the fault spare address information written in the pre-failure storing unit 120.

As shown in FIG. 9, a time point at which data is read from the read controller 400 and the frame memory 500 may be determined by the internal vertical synchronization signal (Internal Vsync) and the internal horizontal synchronization signal (Internal Hsync). Accordingly, the time point 940 of the signal (BIST Pattern Gen Trig) must be controlled such that the BIST data for the BIST can be stored in the frame memory 500 by the write controller 300 before the read controller 400 actually starts to read the data.

Referring to FIG. 9, the CRC handler 200 may receive the read data Rdata and perform the CRC calculation in a period in which the read data valid signal (Read Data Valid) is a logic 1 (high), and may generate the error flag Error_flag according to whether the CRC error occurs at time points 951, 952, 953, and 954 when the read data valid signal (Read Data Valid) falls to a logic 0. The example of FIG. 9 shows that the CRC error occurs at an address 1 and the error flag is generated. Accordingly, the dynamic address mapping unit 130 which has received the error flag receives the address 1 from the read address monitoring unit 140 that monitors and collects the read addresses of read data related to the CRC error. Then, the dynamic address mapping unit 130 writes the address 1 to the fault real address unit 131, thereby indicating that a fault has occurred at the address 1.

Referring to FIG. 9, a user vertical synchronization signal (User Vsync) may be input in order to input the user data from the outside. At a time point 960 when the user vertical synchronization signal (User Vsync) is input, the dynamic address mapping unit 130 may map the fault real address to the non-fault spare address based on the fault real address unit 131 and the non-fault spare address unit 132 which have been updated based on the fault address information obtained up to now, and may transmit the mapping result to the write address mapping unit 330 of the write controller 300 and to the read address mapping unit 430 of the read controller 400. Also, the write controller 300 and the read controller 400 may write the input user data to the frame memory 500 or may read the data from the frame memory 500 in accordance with the updated mapping result. In the example of FIG. 9, the write controller 300 may determine the address of the frame memory 500 in which the user data (USER Wdata) is to be written, based on the updated mapping result for the user address (USER Address) which is input after the time point 960 when the user vertical synchronization signal (User Vsync) is input.

Subsequent operations are continuously repeated and the fault real address unit 131 and the non-fault spare address unit 132 may be updated at the time point when the internal vertical synchronization signal (Internal Vsync) is input. The mapping relationship can be updated by mapping the fault real address to the non-fault spare address, based on the fault real address unit 131 and the non-fault spare address unit 132 which have been updated at the time point when the user vertical synchronization signal (User Vsync) is input.

Figure 10:
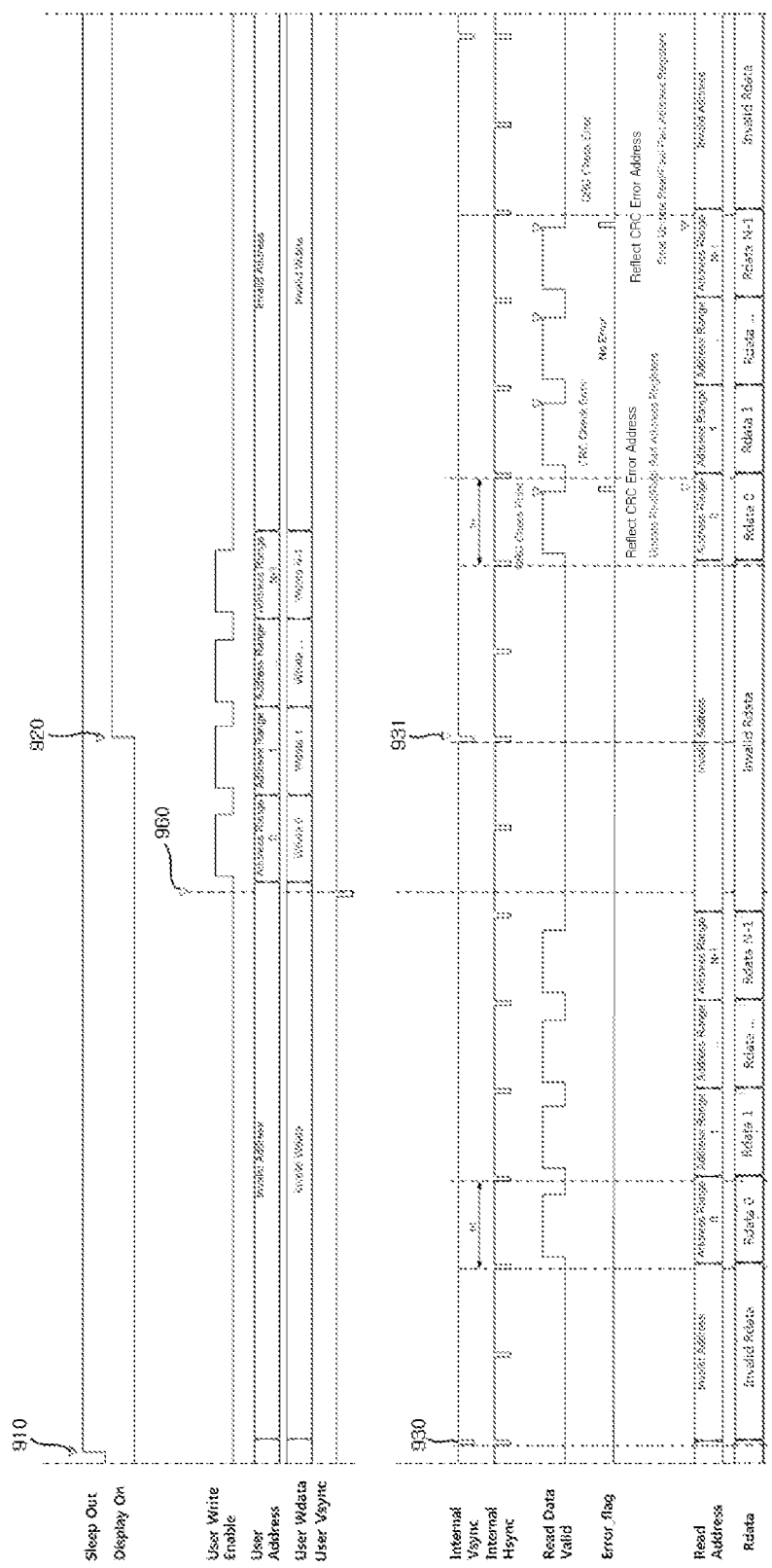
FIG. 10 is a timing diagram showing another example of describing the operation of the SRAM dynamic failure handling system 2000.

FIG. 10 is a timing diagram showing another example of describing the operation of the SRAM dynamic failure handling system 2000.

FIG. 10 also shows an operation immediately after power is applied to the SRAM dynamic failure handling system 2000 or the system 2000 exits the sleep state by a control command. However, FIG. 10 is different from FIG. 9 in that the BIST is not performed. Referring to FIG. 10, since the BIST is not performed, the BIST address and BIST data shown in FIG. 9 are not generated and no data is written to the frame memory 500 until the user data (User Wdata) is input. Accordingly, even though data is read from the frame memory 500 from the time point 930 when the first internal vertical synchronization signal (Internal Vsync) is input, the read data may not be valid.

In this case, the CRC handler 200 may not perform the operation of the CRC check unit 230 based on the fact that no CRC calculation value is stored in the CRC storing unit 220, and as a result, the error flag (Error_flag) may not be generated.

Then, the operation after the time point 960 when the user vertical synchronization signal (User Vsync) is input may be the same as that described with reference to FIG. 9.

As described above, the SRAM dynamic failure handling system 2000 updates and applies the mapping result obtained by mapping the fault real address to the non-fault spare address every time the user vertical synchronization signal (User Vsync) is received, so that the SRAM cell within the frame memory 500 can dynamically repair the fault real address. Accordingly, errors in an image displayed on the display panel 10 of the display device 1000 can be reduced.

Figure 11:
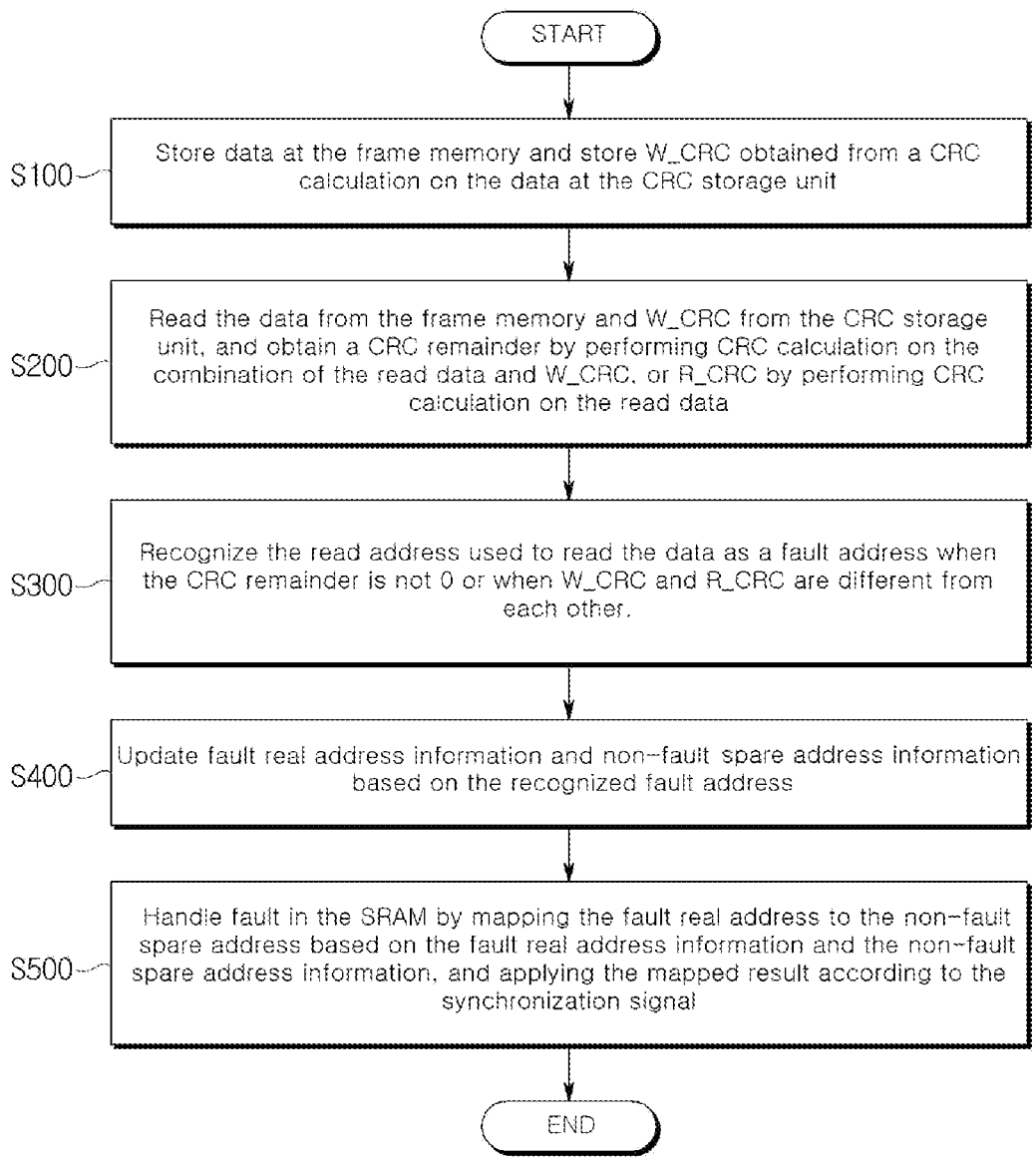
FIG. 11 is a flowchart showing a method in which the SRAM dynamic failure handling system 2000 recognizes and handles the failure of the SRAM by using a cyclic redundancy check (CRC) according to the present disclosure.

FIG. 11 is a flowchart showing a method in which the SRAM dynamic failure handling system 2000 recognizes and handles the failure of the SRAM by using the CRC in accordance with various aspects.

Referring to FIG. 11, in step S100, the SRAM dynamic failure handling system 2000 may store data received from outside of the system at the frame memory 500 and store a CRC remainder W_CRC obtained from a CRC calculation on the data at the CRC storage unit.

In step S200, the SRAM dynamic failure handling system 2000 may read the data from the frame memory 500 and the CRC remainder W_CRC from the CRC storage unit, and may obtain a CRC remainder by performing CRC calculation on the combination of the read data and the CRC remainder W_CRC, or a CRC remainder R_CRC by performing CRC calculation on the read data.

In step S300, the SRAM dynamic failure handling system 2000 may recognize the read address used to read the data as a fault address when the CRC remainder is not 0 or when the CRC remainder W_CRC and the CRC remainder R_CRC are different from each other.

In step S400, the SRAM dynamic failure handling system 2000 may update the fault real address information and non-fault spare address information based on the recognized fault address. According to the aspect, when the fault address corresponds to the real address, the SRAM dynamic failure handling system 2000 may update the fault real address information by adding the corresponding fault address to the fault real address unit 131. When the fault address corresponds to the spare address, the SRAM dynamic failure handling system 2000 may update the non-fault spare address information by deleting the corresponding fault address from the non-fault spare address unit 132.

In step S500, the SRAM dynamic failure handling system 2000 maps the fault real address to the non-fault spare address based on the fault real address information and the non-fault spare address information, and applies the mapped result according to the synchronization signal, and thus, causes the data that should be written to the fault real address to be written to the mapped non-fault spare address, thereby handling the failure in the SRAM.

What is claimed is:

1. A static random-access memory (SRAM) failure handling system which dynamically handles a failure of the SRAM based on an input data, comprising:
a frame memory which is composed of the SRAM and comprises a real address area and a spare address area which are distinguished from each other;
a write controller configured to obtain a write data, determine a write address, and store the write data at the write address of the frame memory;
a read controller configured to determine a read address and read a read data of the read address from the frame memory;
a cyclic redundancy check (CRC) handler configured to store a CRC remainder W_CRC generated by performing a CRC calculation on the write data, determine whether, based on the read data and the CRC remainder W_CRC, a CRC error occurs, and generate an error flag when the CRC error occurs; and
a failure handler configured to receive the error flag from the CRC handler, determine a fault address based on the error flag, and map the fault address to one of non-fault spare addresses of the spare address area when the fault address is an address of the real address area,
wherein the failure handler comprises a dynamic address mapping unit which comprises a fault real address unit and a non-fault spare address unit, and
wherein the dynamic address mapping unit configured to:
determine the fault address based on the received error flag and the read address monitored when the error flag is received,
determine whether the fault address is a real address of the real address area or a spare address of the spare address area,
add the fault address to the fault real address unit when the fault address is the real address,
delete the fault address from the non-fault spare address unit when the fault address is the spare address.

2. The SRAM failure handling system of claim 1, wherein the failure handler further comprises:
a read address monitoring unit configured to monitor the read address determined by the read controller.

3. The SRAM failure handling system of claim 2, wherein the fault real address unit comprising fault real address information and the non-fault spare address unit comprising non-fault spare address information, and wherein the dynamic address mapping unit configured to:
generate fault address mapping information by mapping the real addresses comprised in the fault real address unit to the spare address remaining in the non-fault spare address unit.

4. The SRAM failure handling system of claim 2, wherein the failure handler further comprises a pre-failure storing unit configured to store fault address information obtained based on a result of a pre-failure test performed before shipment, and
wherein the dynamic address mapping unit configured to obtain additionally the fault address from the pre-failure storing unit.

5. The SRAM failure handling system of claim 2, wherein the failure handler further comprises a built-in self-test (BIST) pattern generating unit configured to generate a BIST data for performing the BIST in order to recognize and handles the fault address before the frame memory starts normal operations, generate a BIST address at which the BIST data is stored, and transmit the generated BIST address storing the BIST data to the write controller.

6. The SRAM failure handling system of claim 5, wherein the write controller configured to obtain a user address and a user data from outside of the SRAM failure handling system,
wherein the write data is the user data or the BIST data, and
wherein the write address is determined based on the user address or the BIST address.

7. The SRAM failure handling system of claim 6, wherein, when the user address or the BIST address is a fault address included in the fault address mapping information, the write controller configured to determine the non-fault spare address to which the user address or the BIST address is mapped, as the write address, in the fault address mapping information.

8. The SRAM failure handling system of claim 7, wherein the read controller configured to receive an address for reading data from the outside of the SRAM failure handling system, and when the address is the fault address included in the fault address mapping information, the read controller configured to determine the non-fault spare address to which the address is mapped, as the read address, in the fault address mapping information.

9. The SRAM failure handling system of claim 8, wherein the dynamic address mapping unit configured to:
starts again to update the fault real address unit and the non-fault spare address unit based on a first vertical synchronization signal received together with the address for reading data from the outside of the SRAM failure handling system, and
transmits the fault address mapping information to the write controller and the read controller based on a second vertical synchronization signal obtained together with the user address and the user data from outside of the SRAM failure handling system.

10. The SRAM failure handling system of claim 1, wherein the CRC handler comprises:
a CRC calculating unit configured to generate the CRC remainder W_CRC by performing a CRC calculation on the write data;
a CRC storing unit configured to store the CRC remainder W_CRC; and
a CRC check unit configured to generate a CRC remainder R_CRC by performing the CRC calculation on the read data, obtain the CRC remainder W_CRC from the CRC storing unit, determines that no CRC error has occurred when the CRC remainder R_CRC is coincided with the CRC remainder W_CRC, determine that the CRC error has occurred when they are not coincided, and then, generates the error flag.

11. A method for dynamically handling a failure of a static random-access memory (SRAM) of a SRAM failure handling system which dynamically handles a failure of the SRAM based on an input data, comprising:
obtaining a write data;
determining a write address;
storing the write data at the write address of a frame memory which is composed of the SRAM and comprises a real address area and a spare address area which are distinguished from each other;
storing, a CRC remainder W_CRC, generated by performing a CRC calculation on the write data, at a CRC storing unit;
determining a read address;
reading a read data from the read address of the frame memory;
determining whether, based on the CRC remainder W_CRC obtained from the CRC storing unit and the read data, a CRC error occurs, and generating an error flag when the CRC error occurs;
determining a fault address based on the error flag; and
mapping the fault address to one of non-fault spare addresses of the spare address area when the fault address is an address of the real address area,
wherein the mapping of the fault address to one of non-fault spare addresses of the spare address area when the fault address is an address of the real address area comprises:
determining whether the fault address is a real address of the real address area or a spare address of the spare address area;
adding the fault address to a fault real address unit when the fault address is the real address;
deleting the fault address from a non-fault spare address unit when the fault address is the spare address.

12. The method of claim 11, wherein the determining the fault address based on the error flag comprises determining the read address at a time point when the error flag is received, as the fault address.

13. The method of claim 11, wherein the mapping of the fault address to one of non-fault spare addresses of the spare address area when the fault address is an address of the real address area comprises:
generating fault address mapping information by mapping the real address comprised in the fault real address unit to the spare address remaining in the non-fault spare address unit.

14. The method of claim 13, further comprising:
storing fault address information obtained based on a result of a pre-failure test performed before shipment; and
obtaining additionally the fault address based on the fault address information.

15. The method of claim 13, further comprising:
obtaining a user address and a user data from the outside of the SRAM failure handling system; and
generating a built-in self-test (BIST) data for performing the BIST, and a BIST address at which the BIST data is to be stored,
wherein the obtaining the write data comprises selecting the user data or the BIST data as the write data, and wherein the determining the write address comprises determining the write address based on one of the user address or the BIST address.

16. The method of claim 15, wherein the determining of the write address based on one of the user address or the BIST address comprises determining the non-fault spare address to which the user address or the BIST address is mapped, as the write address, in the fault address mapping information, when the user address or the BIST address is the fault address comprised in the fault address mapping information.

17. The method of claim 16, wherein the determining of the read address comprises:
  receiving an address for reading data from the outside of the SRAM failure handling system; and
  determining the non-fault spare address to which the address is mapped, as the read address, in the fault address mapping information, when the address is the fault address comprised in the fault address mapping information.

18. The method of claim 13, wherein the adding the fault address to the fault real address unit when the fault address is the real address and the deleting of the fault address from the non-fault spare address unit when the fault address is the spare address are performed after receiving a first vertical synchronization signal together with an address for reading data from outside of the SRAM failure handling system.

19. The method of claim 13, wherein the generating fault address mapping information by mapping the spare address remaining in the non-fault spare address unit to the real address comprised in the fault real address unit comprises generating the fault address mapping information based on a second vertical synchronization signal obtained together with the user address and the user data from outside of the SRAM failure handling system.

* * * * *